United States Patent [19]
Togano et al.

[11] Patent Number: 4,729,801
[45] Date of Patent: Mar. 8, 1988

[54] PROCESS FOR PRODUCING SUPERCONDUCTING COMPOUND TAPE OR WIRE MATERIAL BY ELECTRON BEAM IRRADIATION

[75] Inventors: Kazumasa Togano; Hiroaki Kumakura, both of Sakura; Hirosada Irie; Susumu Tsukamoto, both of Yokohama; Kyoji Tachikawa, Tokyo, all of Japan

[73] Assignee: National Research Institute for Metals, Tokyo, Japan

[21] Appl. No.: 890,655

[22] Filed: Jul. 30, 1986

[30] Foreign Application Priority Data

Jul. 30, 1985 [JP] Japan ................... 60-166786
Oct. 21, 1985 [JP] Japan ................... 60-233468

[51] Int. Cl.$^4$ ................... H01L 39/00; C22C 27/02
[52] U.S. Cl. ................... 148/133; 148/11.5 Q
[58] Field of Search ................... 148/11.5 P, 11.5 Q, 148/11.5 R, 133, 4; 29/599

[56] References Cited

U.S. PATENT DOCUMENTS

| | | | |
|---|---|---|---|
| 4,163,156 | 7/1979 | Daetwyler et al. | 29/599 |
| 4,223,434 | 9/1980 | Wang et al. | 148/11.5 P |
| 4,386,970 | 6/1983 | Fukutsuka et al. | 148/11.5 P |
| 4,402,768 | 9/1983 | Flükiger | 148/11.5 P |

Primary Examiner—L. Dewayne Rutledge
Assistant Examiner—S. Kastler
Attorney, Agent, or Firm—Wenderoth, Lind & Ponack

[57] ABSTRACT

A process for producing a superconducting compound tape or wire material, which comprises irradiating electron beams at an acceleration voltage of 5 to 150 KV on a starting tape or wire material consisting essentially of constituent elements of a superconducting compound, a compound between the constituent elements, and/or an alloy between the constituent elements at a power density, determined on the starting tape or wire material, of $1 \times 10^3$ to $1 \times 10^7$ W/cm$^2$ while the starting tape or wire material is moved at a rate of 1 cm to 10 m/sec relative to the electron beams.

11 Claims, No Drawings

PROCESS FOR PRODUCING SUPERCONDUCTING COMPOUND TAPE OR WIRE MATERIAL BY ELECTRON BEAM IRRADIATION

BACKGROUND OF THE INVENTION

1. Field of the Invention

This invention relates to a process for producing a superconducting compound tape or wire by irradiation of electron beams.

2. Description of the Prior Art

A superconducting material having an electric resistance of zero can permit flowing of a large current without power consumption, and the superconducting state is maintained even in a high magnetic field. Because of this characteristic, superconductor materials have come into increasing use as coil materials for electromagnets generating a high magnetic field which are used, for example, in an NMR CT scanner, an energy storage device, a nuclear reactor, and a particle accelerator for high-energy physics.

Alloys such as Nb-Ti and $Nb_3Sn$ and $V_3Ga$, called A-15 type compounds, have previously been used as superconducting materials used in coil materials of electromagnets capable of generating a high magnetic field.

The Nb-Ti alloy has high plasticity and can be directly worked into a wire or tape. $Nb_3Sn$ and $V_3Ga$, the A-15 type compounds, are hard and brittle and cannot be directly worked. Hence, working of these A-15 type compounds into a wire or tape relies on a diffusion reaction by a surface diffusion method or a so-called bronze method.

The upper critical magnetic fields $H_{c2}$ of Nb-Ti, $Nb_3Sn$ and $V_3Ga$ at 4.2 K are 12 T, 21 T and 22 T (T=tesla), respectively. As the applied magnetic field approaches the upper critical magnetic field, the critical current density rapidly decreases. Accordingly, even when a $V_3Ga$ wire is used, the magnetic field generated by a superconducting magnet is 17.5 T at the highest. On the other hand, as the utility of superconductors has been developed, the superconducting magnets have been required to generate a stronger magnetic field, and it has been desired to develop superconducting wires or tapes having higher performance. For example, it is said that a superconducting magnet for Mirrer-type fusion reactors is required to generate a magnetic field of 20 to 24 T. Such a high magnetic field is difficult to obtain by existing $Nb_3Sn$ and $V_3Ga$.

On the other hand, $Nb_3Al$, $Nb_3(Al,Ge)$ and $Nb_3Ga$, which are the A-15 type compound, $PbMo_6S_8$, which is a Chevrel type compound, and NbCN, which is a B1-type compound, have been discovered as compounds having excellent superconducting properties.

The $H_{c2}$ values of $Nb_3Al$, $Nb_3(Al,Ge)$, and $PbMo_6S_8$ are 30 T, 41 T and 50 T, respectively, which are higher than those of $Nb_3Sn$ and $V_3Ga$. If, however, such materials are to be produced by the conventional diffusion method, the heat-treating temperature must be very high. Consequently, the crystal grains become large, and the critical current density Jc of the resulting materials, which is of importance in practical applications, is markedly reduced.

SUMMARY OF THE INVENTION

It is an object of this invention to solve the problems of the prior art, and to provide a process which can easily produce a superconducting compound tape or wire material having excellent superconducting properties represented by a high critical temperature Tc, a high critical magnetic field $H_{c2}$ and a high critical current density Jc which cannot be obtained by the prior art methods.

Investigations of the present inventors in an attempt to achieve the aforesaid object have led to the discovery that if electron beams of a high energy density are irradiated on a starting tape or wire material consisting essentially of raw materials for a superconducting material to rapidly heat and cool it, a superconducting tape or wire material having high Tc, $H_{c2}$ and Jc values, which cannot be obtained by the prior art methods, can be obtained.

According to this invention, there is provided a process for producing a superconducting compound tape or wire material, which comprises irradiating electron beams at an acceleration voltage of 5 to 150 KV, preferably 10 to 40 KV, most preferably 15 to 25 KV, on a starting wire material consisting essentially of raw materials for a superconducting material, i.e. constituent elements of a superconducting compound, a compound between the constituent elements, and/or an alloy between the constituent elements at a power density, determined on the starting tape or wire material, of $1 \times 10^3$ to $1 \times 10^7$ W/cm$^2$, preferably $5 \times 10^3$ to $1 \times 10^5$ W/cm$^2$, most preferably $1 \times 10^4$ to $2.5 \times 10^4$ W/cm$^2$, while the starting material is moved at a rate of 1 cm to 10 m/sec, preferably 5 cm to 1 m/sec, most preferably 10 cm to 30 cm/sec.

DETAILED DESCRIPTION OF THE PREFERRED EMBODIMENTS

If the acceleration voltage of the electron beams is lower than 5 KV, the electron beams are difficult of reaching the inside of the starting tape or wire material, and the material cannot be fully heated. If it exceeds 150 KV, the electron beams pass through the starting material, and the energy cannot be effectively absorbed by the material. If the power density of the electron beams is lower than $1 \times 10^3$ W/cm$^2$, high temperatures sufficient to produce a compound phase by reaction cannot be obtained. If it exceeds $1 \times 10^7$ W/cm$^2$, the starting material is overheated, and undesirable phenomena such as melting off occur.

Irradiation of the electron beams is carried out while the starting material is being moved relative to the electron beams or the electron beams are being moved relative to the electron beams. The rate of moving has to do with the power density of the electron beams. At a high density, the rate should be high, and at a low density, the rate should be low. Preferably, the rate of moving is 1 cm to 10 m/sec. If it is less than 1 cm/sec, the entire starting material is overheated, and a sufficient cooling rate cannot be obtained. If it exceeds 10 m/sec, high temperatures sufficient to produce a compound cannot be obtained.

The superconducting compound as a main component of the superconducting compound tape or wire material in accordance with the process of this invention may, for example, be an A-15 type compound such as $Nb_3Al$, $Nb_3(Al,Ge)$, $Nb_3Ga$, $Nb_3Ge$ and $Nb_3(Al,Si)$, a Chevrel type compound such as $PbMo_6S_8$, $CuMo_6S_8$ and $SnMo_6S_8$, or a B-1 type compound such as NbCN, NbN or NbC. Of these, the A-15 type compounds and the Chevrel type compounds are preferred, and $Nb_3Al$, $Nb_3(Al.Ge)$ and $PbMo_6S_8$ are especially preferred.

In a preferred embodiment of this invention, there is used a starting tape or wire material obtained by molding a powdery composition consisting essentially of powdery metals as constituent elements of the superconducting compound, a powder of a compound between the constituent elements (a compound composed of at least two elements as the constituent elements of the superconducting compound) and/or a powder of an alloy between the constituent elements (an alloy composed of at least two elements as the constituent elements of the superconducting compound) either as such or after filling it into a tube of Nb, Ta, Mo, etc.

Production of the starting tape or wire material in a tube of Nb, Ta or Mo may be effected, for example, by the method described in R. Akihama, R. J. Murphy and S. Foner, IEEE Transactions on Magnetics MAG-17 (1981), p. 274. Direct fabrication of the powdery composition may be carried out, for example, by mixing the starting powders, fabricating the mixture into a cylindrical shape under a pressure of about 10 tons/cm$^2$, and then processing the fabricated cylindrical article into a tape by a rolling machine.

Examples of the powdery composition as a starting material for the superconducting compound tape or wire material may be shown as follows:

(1) In the case of $Nb_3Al$

A powdery composition comprising 5 to 30 atomic percent of Al and 95 to 70 atomic percent of Nb which is a mixture of at least two powders selected from the group consisting of Nb powder, Al powder, a powder of an alloy of Nb and Al, and a powder of a compound composed of Nb and Al. Examples of the compound composed of Nb and Al are $Nb_2Al$, $NbAl$ and $NbAl_3$. The Nb powder and Al powder are preferably used.

(2) In the case of $Nb_3(Al,Ge)$

A powdery composition comprising 5 to 30 atomic percent in total of Al and Ge and 95 to 70 atomic percent of Nb which is a mixture of at least two powders selected from the group consisting of Al powder, Nb powder, Ge powder, a powder of a compound composed of at least two elements of Nb, Al and Ge and a powder of an alloy composed of at least two of Nb, Al and Ge. Examples of the compound of at least two of Nb, Al and Ge are $Nb_2Al$, $NbAl$, $NbAl_3$, $Nb_5Ge_3$ and $NbGe_2$. The Nb powder, Al powder and Ge powder are preferred.

(3) In the case of $Nb_3Ga$

A powdery composition comprising 5 to 30 atomic percent of Ga and 95 to 70 atomic percent of Nb which is a mixture of Nb powder and a powder of a compound composed of Nb and Ga. Examples of the compound of Nb and Ga are $Nb_5Ga_3$, $Nb_3Ga_2$ and $NbGa_3$.

(4) In the case of $PbMo_6S_8$

A powdery composition having the composition $Pb_xMo_6S_y$ wherein $x=0.8-1.2$, and $y=7-9$ which is a mixture of at least two powders selected from the group consisting of Pb powder, PbS powder, Mo powder and $MoS_2$ powder.

(5) In the case of $CuMo_6S_8$

A powdery composition having the composition $Cu_xMo_6S_y$ where $X=0.8-1.2$ and $y=7-9$ which is a mixture of at least two powders selected from the group consisting of Cu powder, $Cu_2S$ powder, Mo powder and $MoS_2$ powder.

(6) In the case of $SnMo_6S_8$

A powdery composition having the composition $Sn_xMo_6S_y$ where $x=0.8-1.2$ and $y=7-9$ which is a mixture of at least two powders selected from the group consisting of Sn powder, SnS powder, Mo powder and $MoS_2$ powder.

(7) In the case of NIeCN

A powdery mixture comprising 30 to 70 atomic percent of Nb and 70 to 30 atomic percent in total of C and N which is a mixture of Nb powder and a powder of a compound of at least two elements selected from the group consisting of Nb, C and N.

The powdery compositions used as the starting material are not limited to the specific powdery compositions given above, and may be any powdery composition which produces the desired superconducting compound.

In another embodiment of this invention, there is used a starting tape or wire material obtained by causing a molten material composed essentially of a constituent element of a superconducting compound or an alloy or compound of constituent elements to penetrate voids in a sintered body of a powder consisting essentially of at least one other constituent element of the superconducting compound, or the interstices of a bundle of fine wires consisting essentially of the other constituent elements or an alloy between such constituent elements, and fabricating the resulting composite material.

The sintered body of the powder may be prepared by compressing a metal powder having a particle diameter of about 0.05 to 0.2 mm into a cylindrical shape, for example, and then heating the shaped product in a vacuum at 2,000 to 2,400° C. for 30 minutes to 2 hours. The resulting sintered body is then immersed in a molten bath of another kind of metal to cause the metal to penetrate the interstices of the sintered body, then inserted into a Nb tube for example, drawn and then rolled to form a starting tape or wire material.

When the fine metal wires are used, the starting tape or wire material can be conveniently obtained, for example, by bundling 500 to 1,000 fine metal wires having a diameter of 0.2 to 0.5 mm, inserting the bundle, for example, into a Nb tube, heating the assembly at 2,000° to 2,400° C. for 30 minutes to 2 hours to sinter the fine wires to each other, immersing the sintered article in a molten bath of another kind of metal to cause the metal to penetrate the interstices of the fine wires, and then drawing and rolling the treated article.

Examples of the starting powder for the sintered body of the metal powder include Nb powder, Mo powder, a powder of Nb-Al alloy, a powder of Nb-Ge powder, a powder of Nb-Ga alloy, a powder of Mo-Pb alloy, a powder of Mo-Cu alloy and a powder of Mo-Sn alloy.

Examples of the starting fine metal wires for the sintered body of the fine metal wires include fine wires of Nb, fine wires of Mo, fine wires of Nb-Al alloy, fine wires of Nb-Ge alloy, fine wires of Nb-Ga alloy, fine wires of Mo-Pb alloy, fine wires of Mo-Cu alloy, and fine wires of Mo-Sn alloy.

Examples of the molten mass to penetrate the voids of the sintered body of the metal powder or the interstices of the fine metal wires include molten masses of Al, Ge, Ga, Al-Ge alloy, Al-Ga alloy, Ge-Ga alloy, Pb-S alloy, a compound containing Pb and S, Cu-S alloy, a compound containing Cu and S, and Sn-S alloy and a compound containing Sn and S.

The composition of the composite material obtained by causing the molten mass of the other kind of constituent element or an alloy or compound containing the other kinds of th constituent elements to penetrate the sintered body of the metal powder or the interstices of the fine metal wires is preferably the same as those described hereinabove with regard to $Nb_3Al$, $Nb_3(Al,Ge)$, $Nb_3Ga$, $PbMo_6S_8$, $CuMo_6S_8$ and $SnMo_6S_8$ in the powdery compositions (1) to (6).

In a still another preferred embodiment of this invention, heat-treatment is carried out before and/or after irradaition of electron beams. This further improves the superconducting properties of the final product.

Heat-treatment after irradiation of electron beams makes the atomic arrangement regular and increases Tc and Jc. Preferably, the heat-treatment is carried out at 300° to 1000° C. for 1 to 500 hours. If the temperature is lower than 300° C. and the treating time is shorter than 1 hour, the regular arrangement of atoms is insufficient, and no improvement in superconducting property can be obtained. If the temperature exceeds 1000° C. and the time exceeds 500 hours, the crystal grains become coarse and the superconducting properties of the product are degraded.

On the other hand, heat-treatment before irradiation of electron beams is carried out preferably at 400° to 2,000° C. for 10 seconds to 10 hours.

The process of this invention can exhibit the following excellent advantages.

(1) Electron beams have a very high energy density. Hence, even when the irradiating part relatively moves at a high speed with respect to the starting tape or wire material, the irradiated part of the tape or wire material is instantaneously heated to a sufficiently high temperature, and it is easy to produce a stoichiometric compound phase which is stable at high temperatures, and has excellent properties.

Accordingly, superconducting compounds having excellent properties such as $Nb_3Al$, $Nb_3(Al,Ge)$ and $PbMo_6S_8$ to which the conventional diffusion method is difficult to apply can be easily processed into tapes or wires.

(2) Since heating is done by high-energy density electron beam irradiation, only the irradiated part of the tape or wire material is heated. After irradiation, the heat is dissipated rapidly by heat transmission. Hence, the rapid cooling effect is great, and a high-temperature stable phase can be maintained even at room temperature. Furthermore, the crystal grains can be maintained small, and the resulting tape or wire has a high Jc value.

(3) Electron beams can be irradiated by moving the starting tape or wire material or electron beams at a high speed. The production efficiency is high, and a long tape or wire material can be easily produced. The cost of production is also low.

(4) Since the tape or wire material obtained by the process of this invention as excellent superconducting critical current characteristics, the amount of the tape or wire material required to generate a strong magnetic field can be small, and the expenses for cooling, etc. can be curtailed.

The following examples illustrate the present invention more specifically.

EXAMPLE 1

Nb powder (75 atomic percent) and Al powder (25 atomic percent) were mixed, and the mixture was compacted into a Nb tube having an inside diameter of 16 mm and an outside diameter of 20 mm, and worked into a tape having a width of 5 mm and a thickness of 150 micrometers by a swaging machine, a wire drawing machine, a rolling machine, etc. While this tape was moved in vacuum at a rate of 20 cm/sec, electron beams were irradiated onto it at an acceleration voltage of 20 KV and a current density of 10 mA/mm² to react the Nb powder and the Al powder and form a $Nb_3Al$ superconducting compound. Only the irradiated part of the tape was heated, and the heat was dissipated to the unirradiated part by thermal conduction. As a result, the tape was rapidly cooled.

The above procedure was repeated except that the tape was heat-treated at 1000° C. for 30 minutes before irradiation, and/or at 700° C. for 100 hours after irradiation.

Tc values and Jc values in a magnetic field at 10 T and 17 T of the resulting $Nb_3Al$ tapes and a $Nb_3Al$ tape obtained by the conventional diffusion heat-treatment are shown in Table 1.

TABLE 1

| Process | Tc (K) | Jc (A/cm²) 10T, 4.2K | Jc (A/cm²) 17T, 4.2K |
|---|---|---|---|
| Invention | 16.5 | $3 \times 10^4$ | $5 \times 10^3$ |
| Invention (heat-treatment before irradiation) | 17.0 | $3.5 \times 10^4$ | $7 \times 10^3$ |
| Invention (heat-treatment after irradiation) | 17.8 | $4 \times 10^4$ | $1 \times 10^4$ |
| Invention (heat-treatment before and after irradiation) | 17.9 | $5 \times 10^4$ | $1.5 \times 10^4$ |
| Conventional diffusion method | 16.0 | $1 \times 10^4$ | $1 \times 10^3$ |

As shown by the above table, since the tapes obtained by the process of this invention have fine crystal grains, they have much higher Jc values than the tape obtained by the conventional diffusion method.

EXAMPLE 2

Nb powder (75 atomic percent), Al powder (20 atomic percent) and Ge powder (5 atomic percent) were mixed, and the mixture was compacted into a Nb tube and worked into a tape having a width of 5 mm and a thickness of 150 micrometers by the same technique as in Example 1. While the tape was moved at a rate of 20 cm/sec. in vacuum, electron beams were irradiated at an acceleration voltage of 20 KV and a current density of 10 mA/mm² to react the Nb powder, Al powder and Ge powder and produce an $Nb_3(Al,Ge)$ superconducting compound. Only the irradiated part of the tape was heated, and the heat was dissipated to the unirradiated part by thermal conduction. As a result, the tape was rapidly cooled.

The above procedure was repeated except that after irradiation, the tape was heat-treated at 700° C. for 100 hours.

The Tc values and Jc values in a magnetic field at 10 T and 17 T of the resulting $Nb_3(Al,Ge)$ tapes and an $Nb_3(Al,Ge)$ tape obtained by the conventional diffusion method are shown in Table 2.

TABLE 2

| Process | Tc (K) | Jc (A/cm²) 10T, 4.2K | Jc (A/cm²) 17T, 4.2K |
|---|---|---|---|
| Invention | 18.3 | $3.5 \times 10^4$ | $7 \times 10^3$ |
| Invention (heat-treatment | 19.7 | $4 \times 10^4$ | $1.5 \times 10^4$ |
| Conventional diffusion method | 17.8 | $1 \times 10^4$ | $1.5 \times 10^3$ |

As in Example 1, since the tapes obtained by the process of this invention have fine crystal grains, they have much higher Jc values than the tape obtained by the conventional diffusion method.

EXAMPLE 3

Pb powder, Mo powder and $MoS_2$ (molybdenum disulfide) powder were mixed in a ratio of 1:2:4 (by atomic percent), and the mixture was sealed into a Ta tube having an inside diameter of 6 mm and an outside diameter of 10 mm, and worked into a tape having a width of 5 mm and a thickness of 150 micrometers by a swaging machine, a wire drawing machine, a rolling machine, etc. While this tape was moved in vacuum at a rate of 10 cm/sec, electron beams were irradiated onto it at an acceleration voltage of 20 KV and a current density of 10 $mA/mm^2$ to form a $PbMo_6S_8$ compound. Only the irradiated part of the tape was heated, and the heat was dissipated to the unirradiated part by thermal conduction. As a result, the tape was rapidly cooled.

The above procedure was repeated except that the tape was heat-treated at 500° C. for 100 hours after irradiation.

Tc values and Jc values in a magnetic field at 10 T and 17 T of the resulting $PbMo_6S_8$ tapes and a $PbMo_6S_8$ tape obtained by the conventonal diffusion heat-treatment are shown in Table 3.

TABLE 3

| Process | Tc (K) | Jc (A/cm$^2$) 10T, 4.2K | Jc (A/cm$^2$) 17T, 4.2K |
|---|---|---|---|
| Invention | 13.9 | 2.3 × 10$^4$ | 8 × 10$^3$ |
| Invention (heat-treatment after irradiation) | 14.5 | 3 × 10$^4$ | 1.5 × 10$^4$ |
| Conventional diffusion method | 13.7 | 2 × 10$^4$ | 5 × 10$^3$ |

As shown by the above table, since the tapes obtained by the process of this invention have fine crystal grains, they have much higher Jc values than the tape obtained by the conventional diffusion method.

EXAMPLE 4

Nb powder having a particle diameter of about 0.1 mm was press-formed and heated at 2200° C. for 1 hour to sinter it. The sintered body was immersed in an aluminum bath heated at about 800° C. to cause Al to penetrate the voids of the sintered body. The sintered body was inserted into an Nb tube, drawn and rolled to produce a tape having a width of 6 mm and a thickness of 100 micrometers.

While the tape was moved at a rate of 10 cm/sec. in vacuum, electron beams were irradiated at an acceleration voltage of 20 KV and a current density of 7 $mA/mm^2$ to react the Nb sintered body and Al which penetrated its voids and to produce a $Nb_3Al$ superconducting compound. Only the irradiated part of the tape was heated, and the heat was dissipated to the unirradiated part by thermal conduction. As a result, the tape was rapidly cooled.

The above procedure was repeated except that the tape was heat-treated at 1000° C. for 30 minutes before the irradiation, or at 700° C. for 100 hours after the irradiation.

The Tc values and Jc values in a magnetic field at 10 T and 17 T of the resulting $Nb_3Al$ tapes and a $Nb_3Al$ tape obtained by the conventional diffusion method are shown in Table 4.

TABLE 4

| Process | Tc (K) | Jc (A/cm$^2$) 10T, 4.2K | Jc (A/cm$^2$) 17T, 4.2K |
|---|---|---|---|
| Invention | 16.7 | 6 × 10$^4$ | 4 × 10$^4$ |
| Invention (heat-treatment before irradiation) | 17.0 | 8 × 10$^4$ | 4 × 10$^4$ |
| Invention (heat-treatment after irradiation) | 18.3 | 9 × 10$^4$ | 5 × 10$^4$ |
| Conventional diffusion method | 16.1 | 1.5 × 10$^4$ | 1.5 × 10$^3$ |

As shown in the above table, since the tapes obtained by the process of this invention have fine crystal grains, they have much higher Jc values than the tape obtained by the conventional diffusion method.

EXAMPLE 5

About 800 fine wires of Nb each having a diameter of 0.3 mm were bundled, inserted into a Nb tube, and heated at 2200° C. for 1 hour to sinter the Nb wires to each other. The sintered body was immersed in an Al (90 atomic percent)Ge (10 atomic percent) bath heated at about 800° C. to cause the Al-Ge alloy to penetrate the interstices of the fine wires, then drawn and rolled to produce a tape having a width of 6 mm and a thickness of 100 micrometers. While this tape was moved in vacuum at a rate of 10 cm/sec, electron beams were irradiated onto it at an acceleration voltage of 20 KV and a current density of 7 $mA/mm^2$ to react the Nb wires and the Al-Ge alloy and to form a $Nb_3(Al,Ge)$ superconducting compound. Only the irradiated part of the tape was heated, and the heat was dissipated to the unirradiated part by thermal conduction. As a result, the tape was rapidly cooled.

The above procedure was repeated except that the tape was heat-treated at 700° C. for 100 hours after irradiation.

Tc values and Jc values in a magnetic field at 10 T and 17 T of the resulting $Nb_3(Al,Ge)$ tapes and a $Nb_3(Al,Ge)$ tape obtained by the conventional diffusion heat-treatment are shown in Table 5.

TABLE 5

| Process | Tc (K) | Jc (A/cm$^2$) 10T, 4.2K | Jc (A/cm$^2$) 17T, 4.2K |
|---|---|---|---|
| Invention | 17.1 | 5 × 10$^4$ | 2 × 10$^4$ |
| Invention (heat-treatment after irradiation) | 19.3 | 5 × 10$^4$ | 2.5 × 10$^4$ |
| Conventional diffusion method | 17.8 | 2 × 10$^4$ | 3 × 10$^3$ |

As shown by the above table, since the tapes obtained by the process of this invention have fine crystal grains, they have much higher Jc values than the tape obtained by the conventional diffusion method.

EXAMPLE 6

About 800 fine wires of Mo each having a diameter of 0.3 mm were bundled, inserted into a Ta tube, and heated at 2,400° C. for 1 hour to sinter the Mo wires to each other. The sintered body was immersed in a Pb (60 atomic percent)-S (40 atomic percent) bath heated at about 1200° C. to cause the Pb-S molten mass to penetrate the interstices of the fine wires, then drawn and rolled to produce a tape having a width of 6 mm and a thickness of 0.2 mm. While this tape was moved in vacuum at a rate of 10 cm/sec, electron beams were irradiated onto it at an acceleration voltage of 20 KV and a current density of 7 mA/mm² to react the Mo wires and the Pb-S alloy and to form a PbMo$_6$S$_8$ superconducting compound. Only the irradiated part of the tape was heated, and the heat was dissipated to the unirradiated part by thermal conduction. As a result, the tape was rapidly cooled.

The above procedure was repeated except that the was heat-treated at 500° C. for 100 hours after irradiation.

Tc values and Jc values in a magnetic field at 10 T and 17 T of the resulting PbMo$_6$S$_8$ tapes and a PbMo$_6$S$_8$ tape obtained by the conventional diffusion heat-treatment are shown in Table 6.

TABLE 6

| Process | Tc (K) | Jc (A/cm²) 10T, 4.2K | Jc (A/cm²) 17T, 4.2K |
| --- | --- | --- | --- |
| Invention | 12.8 | $2 \times 10^4$ | $8 \times 10^3$ |
| Invention (heat-treatment after irradiation) | 13.0 | $2 \times 10^4$ | $1 \times 10^4$ |
| Conventional diffusion method | 12.0 | $1 \times 10^4$ | $3 \times 10^3$ |

As shown in the above table, since the tapes obtained by the process of this invention have fine crystal grains, they have much higher Jc values than the tape obtained by the conventional diffusion method.

What is claimed is:

1. A process for producing a superconductiong compound tape or wire material, which comprises irradiating electron beams at an acceleration voltage of 5 to 150 KV on a starting tape or wire material consisting essentially of constituent elements of a superconducting compound, a compound between the constituent elements, an alloy between the constituent elements or a mixture of at least two of said elements, said compound between the constituent elements and said alloy at a power density, determined on the starting tape or wire material, of $1 \times 10^3$ to $1 \times 10^7$ w/cm² while the starting material is moved at a rate of 1 cm to 10 cm/sec relative to the electron beams.

2. The process of claim 1 wherein the starting tape or wire material is a tape or wire material obtained by inserting into a tube a powdery composition consisting essentially of a powder of the constituent elements of a superconducting compound, a powder of the compound between the constituent elements, a powder of the alloy between the constituent elements or a mixture of at least two of said powders of the constituent elements, said powder of the compound and said powder of the alloy and working the tube having the powder composition, or by molding the powdery composition directly.

3. The process of claim 2 wherein the tube is a tube of Nb, Ta or Mo.

4. The process of claim 2 wherein the tape or wire material is heat-treated at 400° to 2000° C. for 10 seconds to 10 hours before the irradiation of electron beams or at 300° to 1000° C. for 1 to 500 hours after the irradiation of electron beams.

5. The process of claim 1 wherein the starting tape or wire material is a tape or wire material obtained by causing a molten material consisting essentially of a constituent element of a superconducting compound or an alloy or compound of constituent elements to penetrate voids in a sintered body of a powder consisting essentially of at least one other constituent element of the superconducting compound, or the interstices of a bundle of fine wires consisting essentially of the other constituent elements or an alloy between such constituent elements, and fabricating the resulting composite material.

6. The process of claim 5 wherein the superconducting compound is a A-15 type superconducting compound or a Chevrel type superconducting compound.

7. The process of claim 5 wherein the sintered body or the fine wires are a sintered body of Nb or fine wires of Nb, and the molten material is a molten mass of at least one element selected from the group consisting of Al, Ge, Si and Ga.

8. The process of claim 5 wherein the sintered body or the fine wires are a sintered body of Mo or fine wires of Mo, and the molten material is a molten mass of S and at least one element selected from the group consisting of Pb, Sn and Cu.

9. The process of claim 5 wherein the wire material is heat-treated at 400° to 2000° C. for 10 seconds to 10 hours before the irradiation of electron beams or at 300° to 1000° C. for 1 to 500 hours after the irradaition of electron beams.

10. The process of claim 2, wherein the tape or wire material is heat-treated at 400° to 2000° C. for 10 seconds to 10 hours before the irradiation of electron beams and at 300° C. to 1000° C. for 1 to 500 hours after the irradiation of electron beams.

11. The process of claim 5 wherein the tape or wire material is heat-treated at 400° C. to 2000° C. for 10 seconds to 10 hours before the irradiation of electron beams and at 300° C. to 1000° C. for 1 to 500 hours after the irradiation of electron beams.

* * * * *